United States Patent [19]

Mayer et al.

[11] 3,984,661

[45] Oct. 5, 1976

[54] PRICE CALCULATING AND INDICATING CIRCUIT FOR DISPENSERS

[75] Inventors: Robert Mayer, Ardmore; Stephen M. Fromnick, Glen Riddle, both of Pa.

[73] Assignee: Sun Oil Company of Pennsylvania, Philadelphia, Pa.

[22] Filed: Aug. 2, 1974

[21] Appl. No.: 494,117

[52] U.S. Cl. ........................ 235/92 FL; 235/92 DM; 235/92 PE; 235/92 R; 235/151.34

[51] Int. Cl.$^2$ ........................ B67D 5/22; H03K 21/36

[58] Field of Search ...... 235/92 DM, 92 FL, 92 CC, 235/92 PE, 151.34; 222/27

[56] References Cited

UNITED STATES PATENTS

| | | | |
|---|---|---|---|
| 3,043,508 | 7/1962 | Wright | 235/92 FL |
| 3,601,585 | 8/1971 | Paulsen | 235/92 PE |
| 3,666,928 | 5/1972 | Burke et al. | 235/92 FL |
| 3,678,253 | 7/1972 | Johnston | 235/92 FL |
| 3,696,236 | 10/1972 | Kus | 235/92 FL |

*Primary Examiner*—Joseph M. Thesz
*Attorney, Agent, or Firm*—J. Edward Hess; Donald R. Johnson; William C. Roch

[57] ABSTRACT

In a liquid dispensing apparatus, a train of control pulses are produced at a rate representative of equal fractional parts of a unit volume of the liquid being dispensed, and for each of these control pulses a divider gates to an output circuit a number of pulses (derived from a continuously-operating generator) digitally equal to the price per unit volume of the liquid being dispensed. The gated pulses appearing in said output circuit are counted in continuous fashion by a counter which, during a sustained operation, produces a resultant output pulse at the conclusion of every one thousand pulses fed to its input. These latter output pulses are fed to decade counters which drive the final display devices for exhibit or indication of the total price.

1 Claim, 2 Drawing Figures

PRICE CALCULATING AND INDICATING CIRCUIT FOR DISPENSERS

This invention relates to an improved price calculating and indicating circuit useful in motor fuel dispensing apparatus of the electronic type, such as that disclosed in copending application Ser. No. 455,476, filed Mar. 27, 1974 now U.S. Pat. No. 3,934,756. Although the dispensing apparatus disclosed in the aforementioned application is of the so-called blending type (wherein two different fuel components are blended in different proportions to give different grades of liquid fuel for dispensing), the circuit of the present invention is applicable also to non-blending-type or single-product dispensers. It will be described herein in connection with blending-type dispensers merely for the sake of convenience.

The price calculating circuit disclosed in the previously-mentioned application operates well, and appeared to meet the requirements of governmental regulatory (Weights and Measures) bodies. However, it was later found that there were unique values of both pricing and gallonage wherein the Weights and Measures requirements were not met.

An object of this invention is to provide a novel price calculating and indicating circuit for dispensers.

Another object is to provide a price calculating and indicating circuit which obviates the difficulties experienced in prior circuits.

A further object is to provide a price calculating and indicating circuit which fully meets the Weights and Measures requirements.

Figure 1:
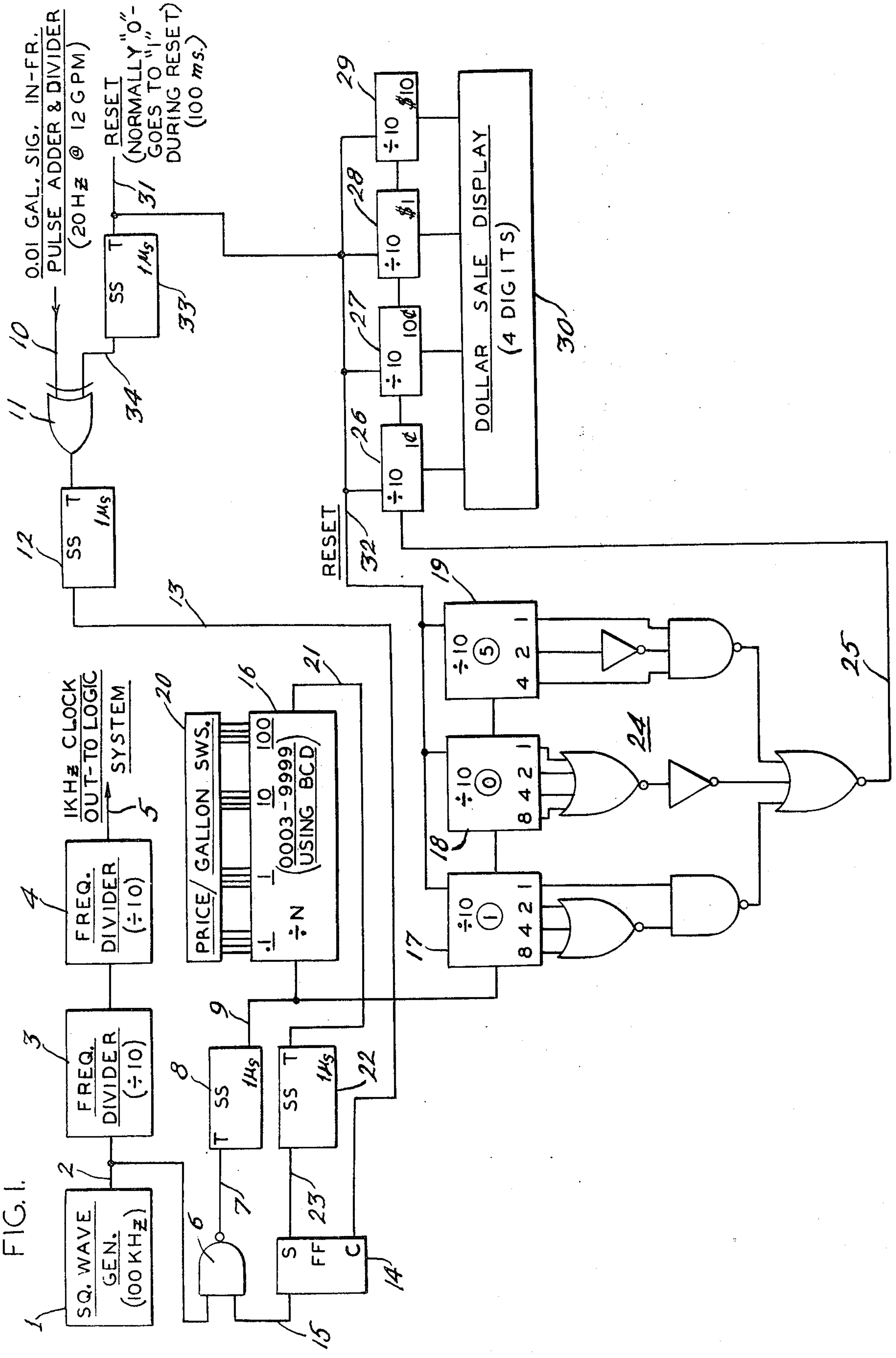
Figure 2:
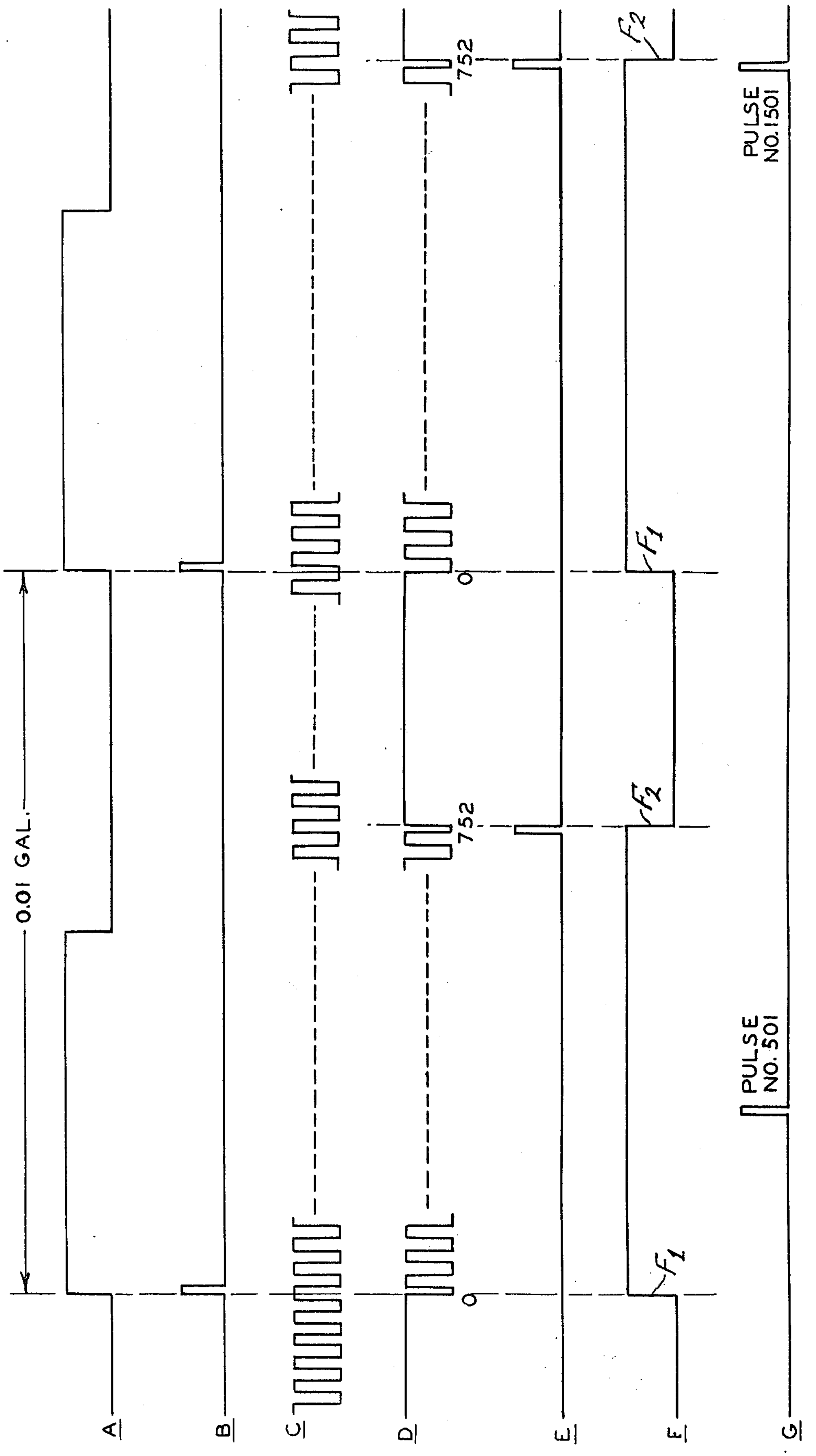

A detailed description of the invention follows, taken in conjunction with the accompanying drawings, wherein:

FIG. 1 is a block diagram (logic diagram) of a circuit according to this invention; and FIG. 2 is a set of waveforms useful in explaining the invention.

Referring now to the drawings, a continuously-operating square wave generator (clock) 1 of 100 KHz is the basic signal source for the system. The generator 1 is preferably in the form of an integrated circuit (IC). The output 2 of generator 1 is represented by waveform C, FIG. 2. A portion of the output of generator 1 is divided by 10 in a frequency divider 3, and then by 10 again in another frequency divider 4, to provide at 5 a clock signal of 1 KHz, which is used for certain purposes in the logic system of the complete or overall dispensing apparatus disclosed in the aforementioned application. The dividers 3 and 4 form no part of the price circuit of the present invention, but are illustrated herein only in order to provide a more complete disclosure.

Another portion of the output of generator 1 is coupled to one input of an AND with logic negation (i.e., a NAND) 6, whose output 7 is coupled to the toggle input T of a single shot or one shot 8 which, when activated, provides an output pulse of one microsecond duration at its output 9. When NAND gate 6 is not inhibited, the 100 KHz square wave output of generator 1 is fed through this gate to the single shot 8 to activate the latter, producing at 9 square pulses of 1 microsecond duration occurring at a repetition rate of 100 KHz.

A signal representative of the total flow of the liquid or liquids being dispensed is supplied at 10 as one of the inputs to an EXCLUSIVE OR 11. This signal represents equal fractional parts of a unit volume (typically, 0.01 gallon) of the liquid being dispensed. In a blending-type liquid dispensing apparatus, as disclosed in the aforementioned application, the flows of the two blending components are separately measured by meters which operate pulsers producing 1000 pulses per gallon, and the outputs of the two pulsers are added and then divided by 10, resulting in the production of pulses at the rate of 100 pulses per gallon of total or combined liquid flow. These latter pulses are used at 10 for the circuit of this invention. Although pulses have been described for flow representation, for convenience and ease of illustration the waveform at 10 is illustrated at A in FIG. 2 as a square wave wherein each complete cycle corresponds to 0.01 gallon of flow of the liquid or liquids being dispensed. With one square wave cycle for each 0.01 gallon, the frequency at 10 would be 20 Hz at 12 gallons per minute of liquid flow.

The 0.01 gallon square wave which appears at the output of the IC 11 is fed to the toggle input T of a single shot or one shot 12 which, when activated, provides an output pulse of 1 microsecond duration at its output 13. The IC 12 is edge triggered by the square wave applied to its T input, resulting in output pulses at 13 which are represented by waveform B, FIG. 2.

Alternatively, it would be possible to make the input 10 comprise short pulses, rather than the 20 Hz square wave previously mentioned. (This could be done, for example, by causing such square wave to toggle a one-shot). In this case, the one shot 12 would not be needed, and the output 13 would be coupled directly to the logic device 11. (The waveform B of FIG. 2 would then be that of the output of logic device 11.)

The pulses at 13 are applied to the reset or clear (C) input of an IC flip-flop 14, resulting in the production at its output 15 of the positive-going portions $F_1$ of waveform, F, FIG. 2. (How the negative-going portions $F_2$ of this waveform are developed will be explained hereinafter.) Thus, at the leading edge or onset of each cycle of the 0.01 gallon square wave A, a pulse B is produced at 13, resulting in the production of a positive-going signal $F_1$ at 15 which activates gate 6 to start the feeding of the clock signal from generator 1 (waveform C) to the IC 8, as illustrated by waveform D, FIG. 2.

The output 9 of the IC 8 is applied to a divide-by-N circuit 16 of IC type, and also to a series of three decade-related counters 17, 18, and 19. Gating of the pulses (derived from generator 1, through the single shot 8) to the counters 17–19 (again of IC type) is effected by the circuit 16. The division N corresponds digitally to the price per gallon of the liquid being dispensed, and is set by three or four price per gallon switches (BCD switches) 20, depending upon whether the price per gallon is a three or four digit number (four switches are indicated). The switches 20 are associated with the circuit 16 in a known manner, to carry out the described function.

Assume (for example) that a price of 75.2 cents per gallon has been established, which means that the switches 20 would be set to 0752. The circuit 16 functions in the manner of a counter. Beginning at the instant when the clock signal is gated into the IC 8, the circuit 16 begins to count the pulses from 8 reaching such circuit. After the number of pulses (assumed to be 752) which correspond to the price per gallon have entered the IC 16, a pulse (waveform E, this pulse occurring at the time of the 752nd cycle of waveform D) is generated on the output connection 21 of the IC 16. This E pulse is coupled to the toggle input T of a single shot or one shot 22 which, when activated, provides an output pulse of 1 microsecond duration at its output 23. This latter pulse is applied to the set (S) input of the IC 14, setting this flip-flop (as illustrated by the negative-going portions $F_2$ of waveform F, FIG. 2), which stops the pulses (on 9) from entering the IC 16 and the counters 17–19, by inhibiting gate 6.

The process previously described is repetitive. After 752 pulses have been gated to the counters 17–19, the system so far described is quiescent (except, of course, for the generator 1, which operates continuously) until the next B pulse arrives at the flip-flop 14 (in response to the onset of the next cycle of the 0.01 gallon square wave A). When this occurs, 752 pulses are again gated to the counters 17–19, and so on for each following cycle of the 0.01 gallon square wave A.

The IC counters 17–19 are divide-by10 counters connected in a series, to provide an overall division factor of 1000. The binary-coded outputs of these counters are connected in a more or less standardized OR-AND-amplifier arrangement denoted generally by numeral 24, in such a manner as to provide on the common output lead 25 an initial pulse after a predetermined number (e.g., 501) pulses have entered this set of counters (from connection 9, to which the input of the "unit" counter 17 is coupled), and subsequent pulses after each additional 1000 pulses (since the counters are divide-by10 counters). Thus, from the beginning of the pricing operation, pulses are produced at the output 25 (see waveform G, FIG. 2) after (for example) 501, 1501, 2501, 3501, etc. pulses supplied to the initial counter 17 (these pulses supplied being represented time-wise by waveform D). The circled numerals on the IC blocks 17–19 denote the "501" setting of these counters.

Prior to starting a delivery from the dispensing apparatus, all of the counters in FIG. 1 are reset to zero (as will later be described in more detail), and under these conditions, the first pulse which appears on line 25 from the ICs 17–19 (see waveform G) occurs after 501 pulses have entered this set of counters. See pulse number 501 on waveform G, during the first 752-pulse count of waveform D. Every subsequent pulse on 25 occurs after an additional 1000 pulses have entered counters 17–19 (from 8); pulse number 1501 is shown on waveform G, FIG. 2, near the end of the second 752-pulse count of waveform D.

The circuit of this invention causes the calculation of total sales (represented by the pulses G on lead 25) to be correct to the nearest ½ cent. The pulses G on lead 25 are supplied to a series of four decade-related dollar counters 26, 27, 28, and 29, which are divide-by10 counters arranged in a series and which drive, respectively, the 1 cent, 10 cent, 1 dollar, and 10 dollar digits of a four-digit total dollar sale display 30. The circuit described operates repetitively, and the digits in the total dollar sale display 30 continuously increase as the number of 0.01 gallon pulses (corresponding to waveform A) continue.

If the price exceeds 1 dollar per gallon, it would be possible for two pulses to occur on line 25 during a single 0.01 gallon cycle (of waveform A). However, this presents no particular problem, since all pulses which occur on this line are counted in the dollar display 30, and the digits of this display change so rapidly that there will be no visual confusion.

Resetting of the counters 17–19 and 26–29 to zero is effected prior to each delivery of fluid (i.e., prior to each gasoline dispensing operation) by the application of a relatively long (100 milliseconds) reset pulse to the connection 31, from which connection the reset bus 32 extends to all of the mentioned counters. The reset connection 31 normally is in the 0-state, but goes to the 1-state during reset.

The reset signal on connection 31 is coupled to the toggle input T of a single shot or one shot 33 which, when activated, provides an output pulse of 1 microsecond duration at its output 34. Output 34 is coupled as the other input to the EXCLUSIVE OR 11. Upon reset, the pulse on 34 goes through the IC 11 and activates the single shot 12. producing a single B pulse (referring to FIG. 2) on 13. This single B pulse results in the same action as in a normal dispensing operation, activating gear 6 to cause the circuit 16 to go through one cycle of operation (i.e, to cause it to count the number of pulses which have been set on the switches 20). However, since this cycle of operation is so short (it would be only 15 milliseconds, for example, even at a price of $1.50 per gallon) compared to the 100 millisecond reset signal being applied to the counters 17–19 and 26–29 at this same time, the counters 17–19 and 26–29 will not count this cycle, and the display 30 will remain at zero.

On the other hand, this pseudo B pulse (meaning a B pulse not representative of liquid flow) will effect a complete resetting of the IC 16, which latter is particularly important if the price setting of switches 20 has been changed between the end of one delivery and the beginning of the next.

The invention claimed is:

1. A price calculating circuit for liquid dispensers and comprising:

a. means for providing a sequence of control pulses respectively representative of equal predetermined volumes of the liquid being dispensed;
b. an Exclusive OR gate coupled to said sequence of control pulses, and having another input from a first single shot generator which is utilized to reset the circuit;
c. a second single shot generator coupled to the output of said Exclusive OR gate;
d. a flip-flop circuit, coupled to the output of said second single shot generator, and adapted to produce an output in response to a pulse from the second single shot generator;
e. a square wave generator means for providing a square wave output at a substantially constant frequency;
f. a NAND gate coupled to the output of said flip-flop and also coupled to the output of said square wave generator for passing an inverted output of said square wave generator during the time interval said flip-flop produces an output;
g. a third single shot generator coupled to the output of said NAND gate for providing pulses in response to outputs of said NAND gate;
h. a divide-by-N circuit coupled to the output of said third single shot generator for performing a division corresponding digitally to the price per quantity of liquid dispensed, said divide-by-N circuit providing an output after a number of pulses corresponding to N have been received thereby;

i. a plurality of manually-operable switches for setting N in said divide-by-N circuit to set the price per unit volume of liquid being dispensed;

j. a fourth single shot generator coupled to the output of said divide-by-N circuit, said fourth single shot generator having its output coupled to said flip-flop for causing said flip-flop to change states in response thereto;

k. counter means coupled to said fourth single shot generator for counting the output thereof and for producing an initial output pulse upon the counting of five hundred and one pulses and thereafter producing output pulses upon the counting of respective equal groups of one thousand clock pulses; and l. means, coupled to said counter means, for counting the output of said counter means for a price indication of the dispensed liquid.

* * * * *